US010615256B2

(12) United States Patent
Cheng et al.

(10) Patent No.: US 10,615,256 B2
(45) Date of Patent: Apr. 7, 2020

(54) NANOSHEET TRANSISTOR GATE STRUCTURE HAVING REDUCED PARASITIC CAPACITANCE

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/020,316

(22) Filed: Jun. 27, 2018

(65) Prior Publication Data

US 2020/0006477 A1    Jan. 2, 2020

(51) Int. Cl.
| | | |
|---|---|---|
| *H01L 29/06* | (2006.01) | |
| *H01L 29/10* | (2006.01) | |
| *H01L 29/66* | (2006.01) | |
| *H01L 29/08* | (2006.01) | |
| *H01L 29/423* | (2006.01) | |
| *H01L 21/02* | (2006.01) | |
| *H01L 29/786* | (2006.01) | |
| *H01L 29/78* | (2006.01) | |
| *H01L 21/3065* | (2006.01) | |
| *H01L 21/311* | (2006.01) | |

(52) U.S. Cl.
CPC .... *H01L 29/0673* (2013.01); *H01L 21/02532* (2013.01); *H01L 21/3065* (2013.01); *H01L 29/0847* (2013.01); *H01L 29/1037* (2013.01); *H01L 29/42392* (2013.01); *H01L 29/66545* (2013.01); *H01L 29/66553* (2013.01); *H01L 29/66742* (2013.01); *H01L 29/66795* (2013.01); *H01L 29/785* (2013.01); *H01L 29/78696* (2013.01); *H01L 21/31116* (2013.01)

(58) Field of Classification Search
CPC ............ H01L 29/0673; H01L 29/0847; H01L 29/1037; H01L 29/42392; H01L 29/66545; H01L 29/66553; H01L 29/66742; H01L 29/66795; H01L 29/785; H01L 29/78696; H01L 21/31116
See application file for complete search history.

(56) References Cited

U.S. PATENT DOCUMENTS

| | | | |
|---|---|---|---|
| 8,084,308 B2 * | 12/2011 | Chang ................. | H01L 27/1203 257/24 |
| 9,362,355 B1 | 6/2016 | Cheng et al. | |
| 9,768,062 B1 | 9/2017 | Kittl et al. | |

(Continued)

*Primary Examiner* — Yosef Gebreyesus
(74) *Attorney, Agent, or Firm* — Cantor Colburn LLP; Vazken Alexanian

(57) ABSTRACT

Embodiments are directed to a method of fabricating a semiconductor device. A non-limiting example of the method includes performing fabrication operations to form a nanosheet field effect transistor device on a substrate. The fabrication operations include, forming a channel stack over the substrate, wherein the channel stack include stacked and spaced apart channel nanosheets. A metal gate is formed adjacent to end regions of the channel stack and around and between the stacked and spaced apart channel nanosheets. A permanent dummy gate is formed above the channel stack.

20 Claims, 12 Drawing Sheets

(56) References Cited

U.S. PATENT DOCUMENTS

| | | |
|---|---|---|
| 9,853,132 B2 | 12/2017 | Cheng et al. |
| 9,859,166 B1 | 1/2018 | Cheng et al. |
| 9,881,926 B1 | 1/2018 | Basker et al. |
| 2015/0206885 A1* | 7/2015 | Barth, Jr. .......... H01L 27/10826 257/301 |
| 2017/0117359 A1* | 4/2017 | Cheng ............... H01L 21/76213 |
| 2017/0222006 A1 | 8/2017 | Suh et al. |
| 2017/0236821 A1 | 8/2017 | Kim et al. |
| 2018/0033871 A1 | 2/2018 | Xie et al. |
| 2018/0047832 A1 | 2/2018 | Tapily et al. |
| 2018/0053837 A1 | 2/2018 | Bi et al. |

* cited by examiner

NANOSHEET TRANSISTOR GATE STRUCTURE HAVING REDUCED PARASITIC CAPACITANCE

BACKGROUND

The present invention relates in general to fabrication methods and resulting structures for semiconductor devices. More specifically, the present invention relates to fabrication methods and resulting structures for nanosheet transistor gate structures having reduced parasitic gate capacitance.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fully depletion in the nanosheet channel regions and reduce short-channel effects.

SUMMARY

Embodiments of the invention are directed a method of fabricating a semiconductor device. A non-limiting example of the method includes performing fabrication operations to form a nanosheet field effect transistor device on a substrate. The fabrication operations include, forming a channel stack over the substrate, wherein the channel stack include stacked and spaced apart channel nanosheets. A metal gate is formed adjacent to end regions of the channel stack and around and between the stacked and spaced apart channel nanosheets. A permanent dummy gate is formed above the channel stack.

Embodiments are directed to a nanosheet field effect transistor device. A non-limiting example of the device includes a channel stack formed over a substrate, wherein the channel stack includes stacked and spaced apart channel nanosheets. A metal gate is located adjacent to end regions of the channel stack and further located around and between the stacked and spaced apart channel nanosheets. A permanent dummy gate is formed above the channel stack.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1A-11C depict a nanosheet-based structure after various fabrication operations for forming a nanosheet FET having a gate structure configured and arranged to reduce parasitic gate capacitance in accordance with aspects of the invention, in which:

FIG. 1A depicts a top-down view of a nanosheet-based structure after initial fabrication operations in accordance with aspects of the present invention;

FIG. 3 depicts a cross-sectional view of the nanosheet-based structure taken along line Y-Y' after fabrication operations in accordance with aspects of the invention;

FIG. 4 depicts a cross-sectional view of the nanosheet-based structure taken along line Y-Y' after fabrication operations in accordance with aspects of the invention;

FIG. 5 depicts a cross-sectional view of the nanosheet-based structure taken along line Y-Y' after fabrication operations in accordance with aspects of the invention;

FIG. 6 depicts a cross-sectional view of the nanosheet-based structure taken along line Y-Y' after fabrication operations in accordance with aspects of the invention;

FIG. 11C depicts a cross-sectional view of the nanosheet FET shown in FIG. 11A taken along line Y-Y'.

DETAILED DESCRIPTION

Figure 1A:
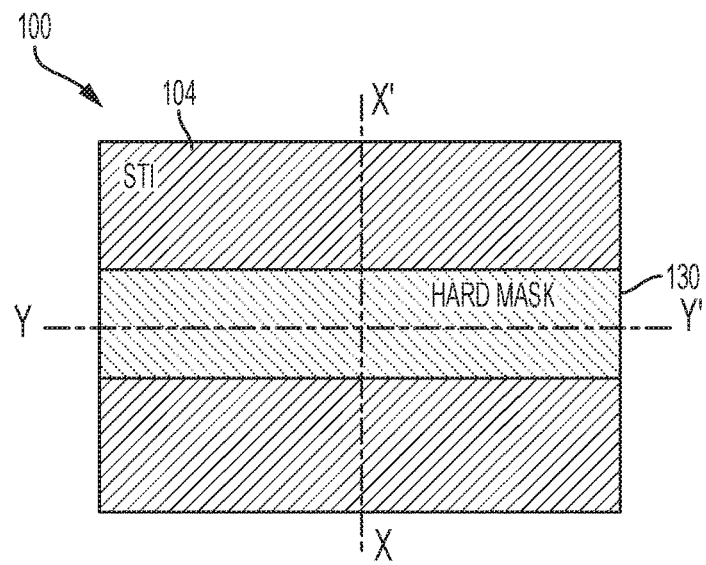

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, while the gate structures of contemporary nanosheet transistor architectures include a gate structure that provides improved control of channel current flow, such gate structures also provide significant overlap with the source/drain (S/D) contacts, which results in unwanted (or parasitic) capacitance.

Turning now to an overview of aspects of the invention, embodiments of the invention provide fabrication methods and resulting structures for nanosheet transistor gate structures having reduced parasitic gate capacitance. In embodiments of the invention, selected regions of the gate structure are replaced with a "permanent" or "hard mask" dummy gate region, which, unlike the other dummy gate structures formed during the fabrication process, is not replaced with a metal gate stack. The hard mask dummy gate region is selected to be a region that will, in the final nanosheet FET device, overlap the S/D drain contacts, the gate contacts, and/or the S/D regions if the S/D regions are tall enough. Because the hard mask dummy gate structure is substantially non-conductive, when it overlaps the S/D drain contacts, the gate contacts, and/or the S/D regions, the hard mask dummy gate structure generates no meaningful parasitic capacitance.

In embodiments of the invention, a hard mask material (e.g., a nitride) is used to pattern and form an elongated fin-shaped structure in an alternating stack of channel nanosheets and sacrificial nanosheets. In known nanosheet transistor fabrication operations, the hard mask used to pattern and form the fin-shaped alternating stack of channel nanosheets and sacrificial nanosheets is removed and the space that was occupied by the hard mask is ultimately occupied first by an amorphous silicon dummy gate and then by the replacement metal gate. However, in accordance with aspects of the invention, after patterning the fin-shaped alternating stack of channel/sacrificial nanosheets, the hard mask remains and functions as the hard mask dummy gate region. In accordance with aspects of the invention, the amorphous silicon dummy gate is formed over and around the hard mask dummy gate, S/D regions are formed, and a replacement metal gate (RMG) process is applied to replace the amorphous silicon dummy gate with a metal gate stack. S/D contacts are formed to the S/D regions, and gate contacts are formed to the metal gate stack. Because the hard mask or permanent dummy gate was intentionally positioned to occupy a region that would, in a conventional fabrication process, have been occupied by the metal gate stack and would have overlapped with the S/D drain contacts, the gate contacts, and/or the S/D regions, no meaningful parasitic gate capacitance is generated. Additionally, because the hard mask dummy gate structure is substantially non-conductive, when it overlaps the S/D drain contacts, the gate contacts, and/or the S/D regions, the hard mask dummy gate structure generates no meaningful parasitic capacitance.

Figure 1B:
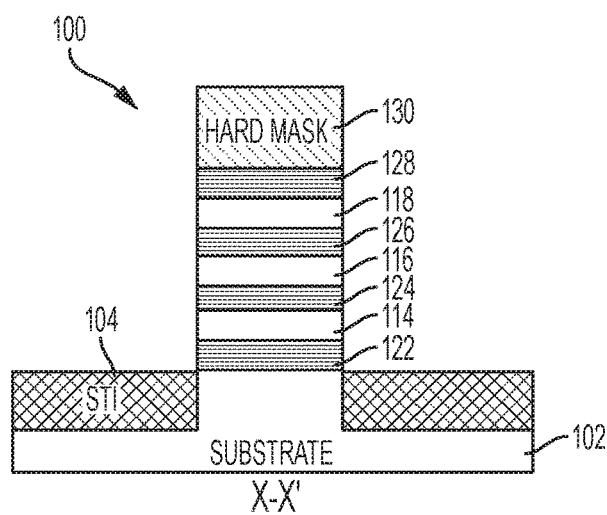
FIG. 1B depicts a cross-sectional view of the nanosheet-based structure shown in FIG. 1A taken along line X-X'.
Figure 1C:
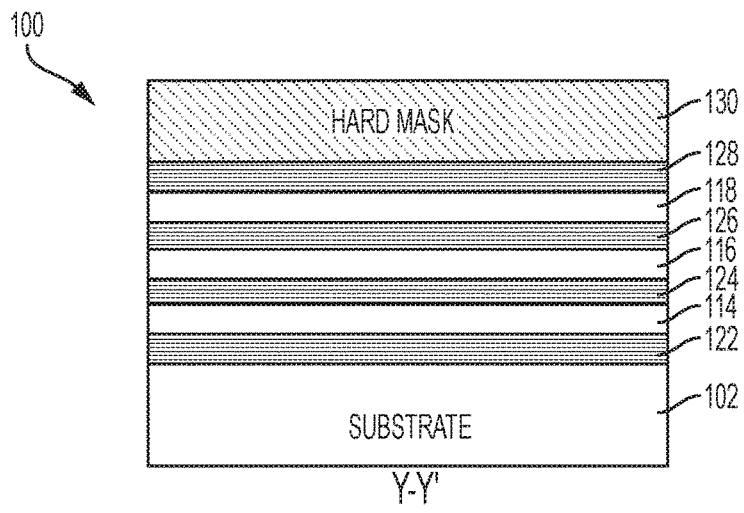
FIG. 1C depicts a cross-sectional view of the nanosheet-based structure shown in FIG. 1A taken along line Y-Y'.

Turning now to a more detailed description of fabrication operations according to aspects of the invention, FIGS. 1A-11C depict a nanosheet-based structure 100 after various fabrication operations for forming a nanosheet FET 100A (shown in FIGS. 11A-11C) having a gate structure configured and arranged to reduce parasitic gate capacitance in accordance with aspects of the invention. FIG. 1A depicts a top-down view of the nanosheet-based structure 100 after initial fabrication operations in accordance with aspects of the present invention. FIG. 1B depicts a cross-sectional view of the nanosheet-based structure 100 taken along line X-X' shown in FIG. 1A, and FIG. 1C depicts a cross-sectional view of the nanosheet-based structure 100 taken along line Y-Y' shown in FIG. 1A. As best shown in FIG. 1B, known fabrication operations have been used to fabricate the nanosheet-based structure 100 to include a substrate 102, shallow trench isolation (STI) regions 104 formed over the substrate 102, a fin-shaped elongated stack of alternating sacrificial nanosheets 122, 124, 126, 128 and channel nanosheets 114, 116, 118 formed over the substrate, and a hard mask 130 formed over the sacrificial channel nanosheet 128.

In embodiments of the invention, the structure 100 shown in FIG. 1B can be fabricated by growing alternating sacrificial layers and channel layer over the substrate 102. In embodiments of the invention, the alternating nanosheet layers depicted are formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

In embodiments of the invention, a patterned hard mask (not shown) is deposited over the alternating nanosheet layers. The pattern of the hard mask defines the footprints of the hard mask 130 and the fin-shaped elongated stack of alternating sacrificial nanosheets 122, 124, 126, 128 and channel nanosheets 114, 116, 118. An etch (e.g., an RIE) or a recess is applied to remove the portions of the alternating nanosheet layers that are not covered by the patterned hard mask, thereby forming the hard mask 130 and the fin-shaped elongated stack of alternating sacrificial nanosheets 122, 124, 126, 128 and channel nanosheets 114, 116, 118. The etch/recess also defines a trench (not shown) in which the STI regions 104 are formed. In embodiments of the invention, the substrate 102 is Si, the STI regions 104 are an oxide, the sacrificial nanosheets 122, 124, 126, 128 are SiGe, the channel nanosheets 114, 116, 118 are Si, and the hard mask 130 is a nitride. The SiGe sacrificial nanosheet layers 122, 124, 126, 128 can be SiGe 25%. The notation "SiGe 25%" is used to indicate that 25% of the SiGe material is Ge, and 75% of the SiGe material is Si. In accordance with aspects of the invention, the hard mask 130 will function as a hard mask or permanent dummy gate that will remain in the final nanosheet FET 100A (shown in FIGS. 11A-11C) having a gate structure configured and arranged to reduce parasitic gate capacitance in accordance with aspects of the invention.

Figure 2A:
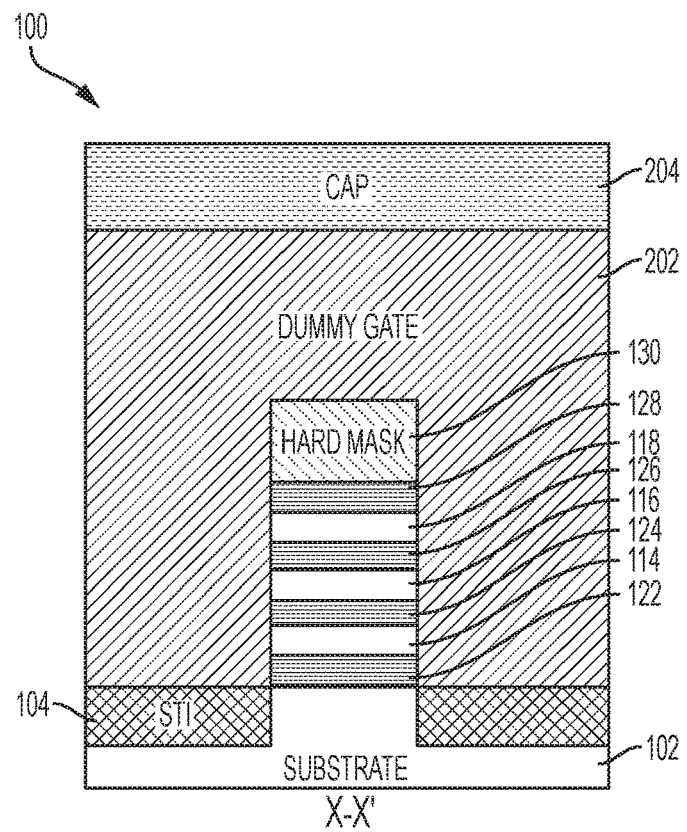
FIG. 2A depicts a cross-sectional view of the nanosheet-based structure taken along line X-X' after fabrication operations in accordance with aspects of the invention.
Figure 2B:
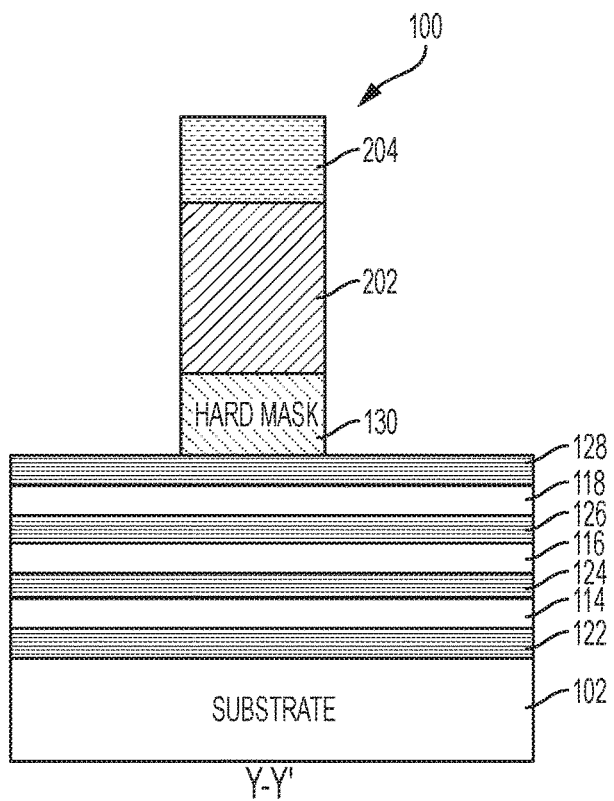
FIG. 2B depicts a cross-sectional view of the nanosheet-based structure taken along line Y-Y' after fabrication operations in accordance with aspects of the invention.

FIG. 2A depicts a cross-sectional view of the nanosheet-based structure 100 taken along line X-X' after fabrication operations in accordance with aspects of the invention, and FIG. 2B depicts a cross-sectional view of the nanosheet-based structure 100 taken along line Y-Y' after fabrication operations in accordance with aspects of the invention. As best shown in FIG. 2A, known fabrication operations have been used to form a dummy gate 202 and a cap layer 204 that extend over and around the hard mask 130 and the fin-shaped elongated stack of alternating sacrificial nanosheets 122, 124, 126, 128 and channel nanosheets 114, 116, 118. The dummy gate 202 can be formed by depositing amorphous silicon (a-Si) over and around the hard mask 130 and the fin-shaped elongated stack of alternating sacrificial nanosheets 122, 124, 126, 128 and channel nanosheets 114, 116, 118. The a-Si is then planarized to a desired level. A hard mask layer (not shown) is deposited over the planarized a-Si and patterned to form the cap layer 204. In embodiments of the invention, the cap layer 204 can be formed from a nitride or an oxide layer. An etching process (e.g., an RIE) is applied to the a-Si to form the dummy gate 202.

Figure 3:
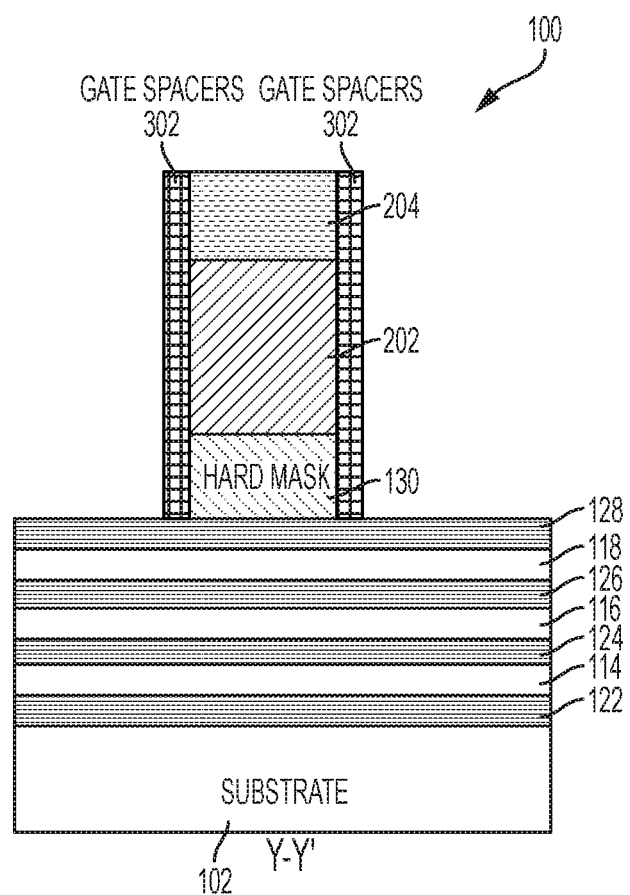

FIG. 3 depicts a cross-sectional view of the nanosheet-based structure 100 taken along line Y-Y' after fabrication operations in accordance with aspects of the invention. As shown in FIG. 3, known semiconductor fabrication operations have been used to form offset gate spacers 302. In embodiments of the invention, the offset gate spacers can be formed using a spacer pull down formation process. The offset gate spacers 302 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Figure 4:
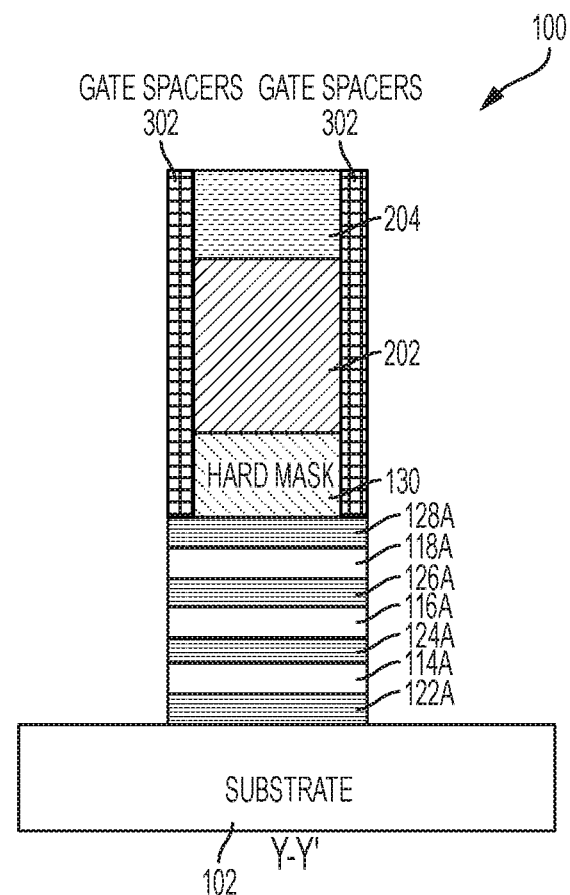

FIG. 4 depicts a cross-sectional view of the nanosheet-based structure 100 taken along line Y-Y' after fabrication operations in accordance with aspects of the invention. As shown in FIG. 4, known semiconductor fabrication operations (e.g., a recess or an etch) have been applied to the fin-shaped elongated stack of alternating sacrificial nanosheets 122, 124, 126, 128 and channel nanosheets 114, 116, 118 (shown in FIGS. 4A, 4B, and 4C) to form a column-shaped stack of alternating sacrificial nanosheets 122A, 124A, 126A, 128A and channel nanosheets 114A, 116A, 118A. The offset gate spacers 302 define a portion of the footprint of the column-shaped stack of alternating sacrificial nanosheets 122A, 124A, 126A, 128A and channel nanosheets 114A, 116A, 118A.

Figure 5:
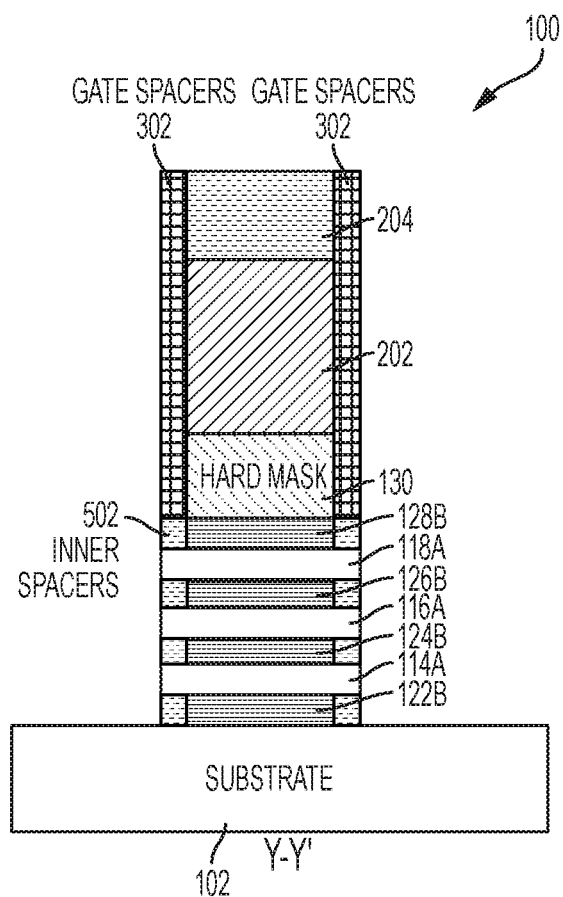

FIG. 5 depicts a cross-sectional view of the nanosheet-based structure 100 taken along line Y-Y' after fabrication operations in accordance with aspects of the invention. As shown in FIG. 5, known semiconductor fabrication operations have been used to partially remove end regions of the sacrificial nanosheets 122A, 124A, 126A, 128A (shown in FIG. 4), thereby forming etched sacrificial nanosheet regions 122B, 124B, 126B, 128B. For example, the end regions of the sacrificial nanosheets 122A, 124A, 126A, 128A can be removed using a so-called "pull-back" process to pull the sacrificial nanosheets 122A, 124A, 126A, 128A back an initial pull-back distance such that their end regions terminate underneath the offset gate spacers 302. In embodiments of the invention, the pull-back process includes a hydrogen chloride (HCL) gas isotropic etch process, which etches the sacrificial nanosheet material (e.g., SiGe) without attacking the channel nanosheet material (e.g., Si). Known semiconductor fabrication processes are then used to form inner spacers 502 in the end regions of the sacrificial nanosheet regions 122B, 124B, 126B, 128B. In embodiments of the invention, the inner spacers 502 can be formed conformally by CVD, or by monolayer doping (MLD) of nitride followed by spacer RIE. The inner spacers 502 can be formed from a nitride containing material (e.g., silicon nitride (SiN)), which prevents excess gauging during subsequent RIE processes (e.g., sacrificial nanosheet removal) that are applied during the semiconductor device fabrication process.

Figure 6:
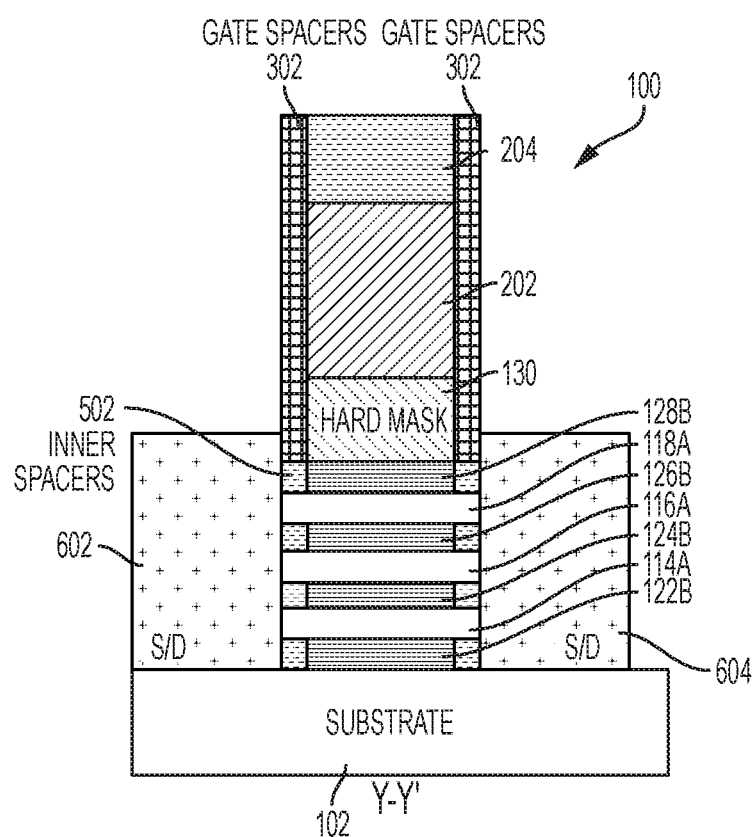

FIG. 6 depicts a cross-sectional view of the nanosheet-based structure 100 taken along line Y-Y' after fabrication operations in accordance with aspects of the invention. As shown in FIG. 6, known semiconductor fabrication operations have been used to form raised S/D regions 602, 604. In embodiments of the invention, the raised S/D regions 602, 604 are formed using an epitaxial layer growth process on the exposed ends of the channel nanosheets 114A, 116A, 118A. In some embodiments of the invention, the raised S/D regions 602, 604 can also be grown from exposed surfaces of the substrate 102 where the substrate is also a single crystalline material (e.g., a single crystalline silicon). In-situ doping (ISD) is applied to dope the S/D regions 602, 604, thereby creating the necessary junctions in the nanosheet FET 100A (shown in FIGS. 11A, 11B, 11C). Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

Figure 7A:
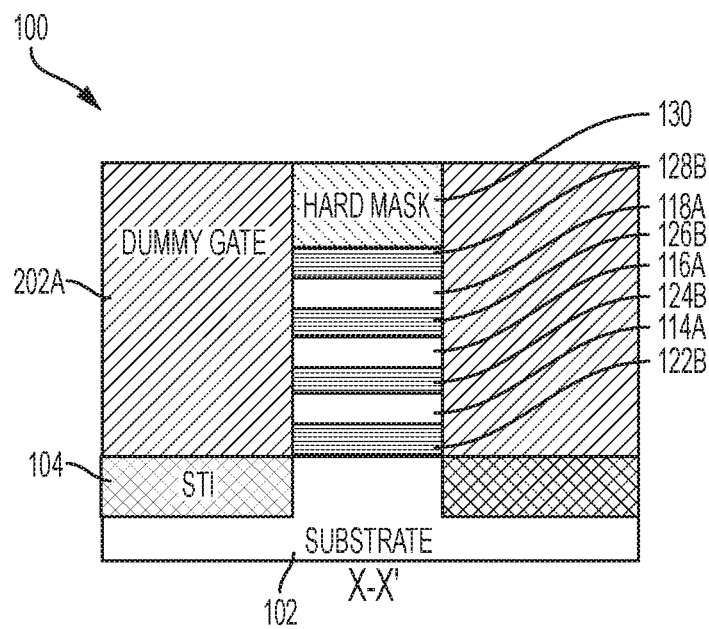
FIG. 7A depicts a cross-sectional view of the nanosheet-based structure taken along line X-X' after fabrication operations in accordance with aspects of the invention.
Figure 7B:
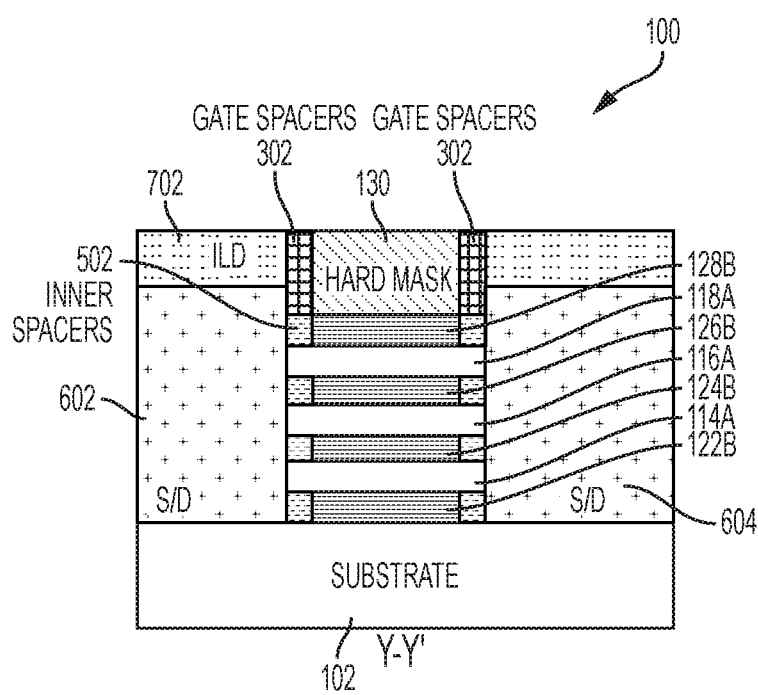
FIG. 7B depicts a cross-sectional view of the nanosheet-based structure taken along line Y-Y' after fabrication operations in accordance with aspects of the invention.

FIG. 7A depicts a cross-sectional view of the nanosheet-based structure 100 taken along line X-X' after fabrication operations in accordance with aspects of the invention, and FIG. 7B depicts a cross-sectional view of the nanosheet-based structure 100 taken along line Y-Y' after fabrication operations in accordance with aspects of the invention. As best shown in FIG. 7B, known semiconductor fabrication operations have been used to form an interlayer dielectric (ILD) region 702. The ILD region 702 can be formed by depositing an oxide material in bulk (e.g., silicon dioxide) and polishing the bulk oxide (including the cap layer 204, the gate spacers 302, and top portions of the dummy gate 202) back (e.g., using CMP) to the level of the hard mask 130, thereby forming recessed dummy gate 202A.

Figure 8A:
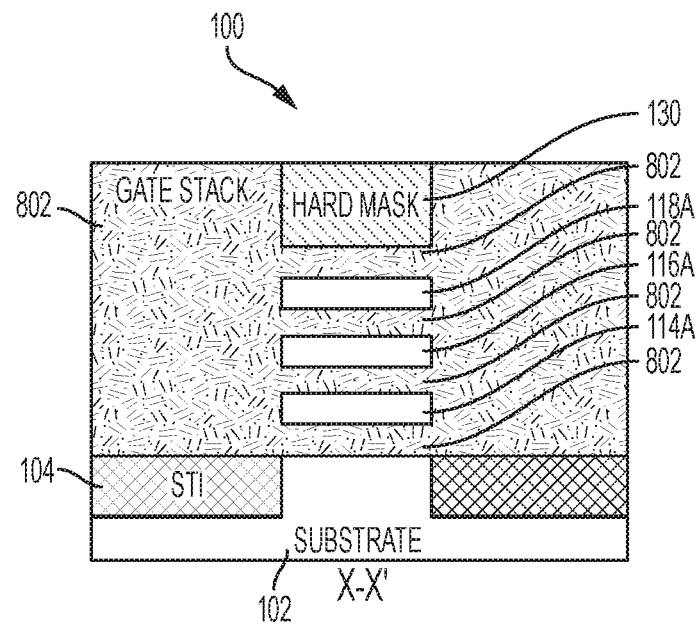
FIG. 8A depicts a cross-sectional view of the nanosheet-based structure taken along line X-X' after fabrication operations in accordance with aspects of the invention.
Figure 8B:
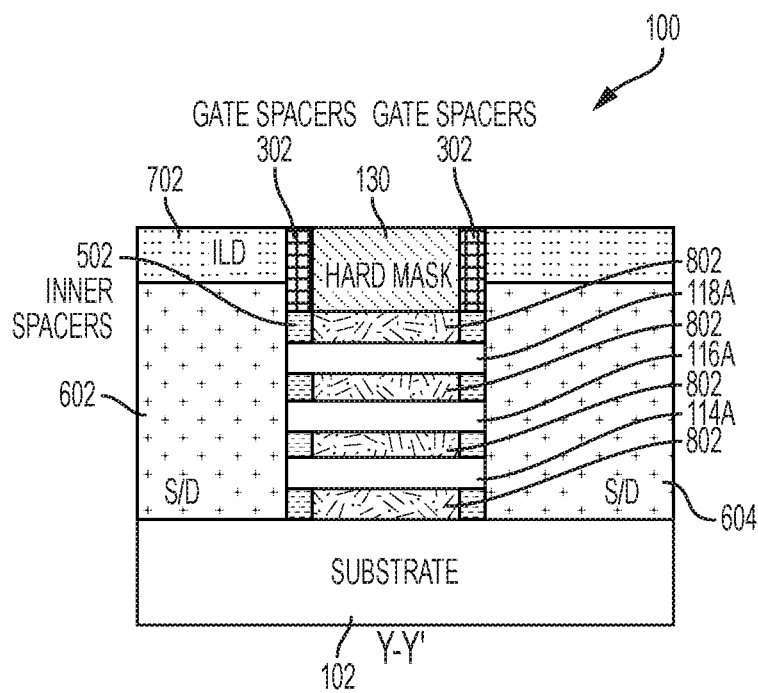
FIG. 8B depicts a cross-sectional view of the nanosheet-based structure taken along line Y-Y' after fabrication operations in accordance with aspects of the invention.

FIG. 8A depicts a cross-sectional view of the nanosheet-based structure 100 taken along line X-X' after fabrication operations in accordance with aspects of the invention, and FIG. 8B depicts a cross-sectional view of the nanosheet-based structure 100 taken along line Y-Y' after fabrication operations in accordance with aspects of the invention. As best shown in FIG. 8A and FIG. 8B, known semiconductor fabrication operations (e.g., a replacement metal gate (RMG) process) have been used remove the recessed dummy gate 202A using, for example, a known etching process, e.g., RIE or chemical oxide removal (COR). Additionally, known semiconductor fabrication operations have been used to remove the sacrificial nanosheet regions 122B, 124B, 126B, 128B (shown in FIG. 7C). In embodiments of the invention, the sacrificial nanosheet regions 122B, 124B, 126B, 128B can be removed by applying a selective etch (e.g., a hydrochloric acid (HCl)). Known semiconductor fabrication processes are then used to replace the removed recessed dummy gate 202A with a multi-segmented gate stack structure 802, which can include a relatively thin (e.g., from about 0.1 nm to about 1 nm) gate dielectric (e.g., silicon oxide) (not shown), a work function metal (not shown) and a primary metal region (not shown). In embodiments of the invention, the relatively thin gate dielectric is between the channel nanosheets 114A, 116A, 118A and the gate stack structure 802 to prevent shorting. In embodiments of the invention, the work function metal of the gate stack structure 802 can be a metal liner. In embodiments of the invention, the work function metal can be, for example, TiN or TaN. As best shown in FIGS. 8B and 8C, the gate stack structure 802 surround the stacked channel nanosheet channels 114A, 116A, 118A and regulate electron flow through the channel nanosheet channels 114A, 116A, 118A between the S/D region 602 and the S/D region 604.

Figure 9A:
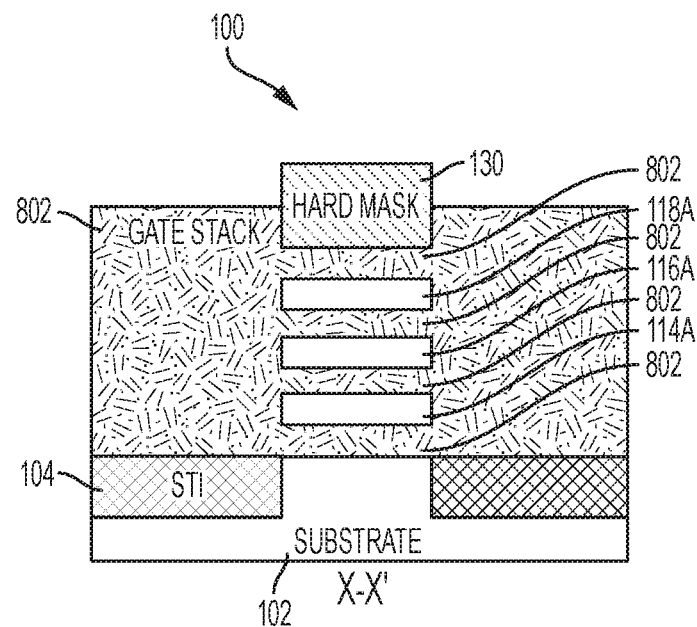
FIG. 9A depicts a cross-sectional view of the nanosheet-based structure taken along line X-X' after fabrication operations in accordance with aspects of the invention.
Figure 9B:
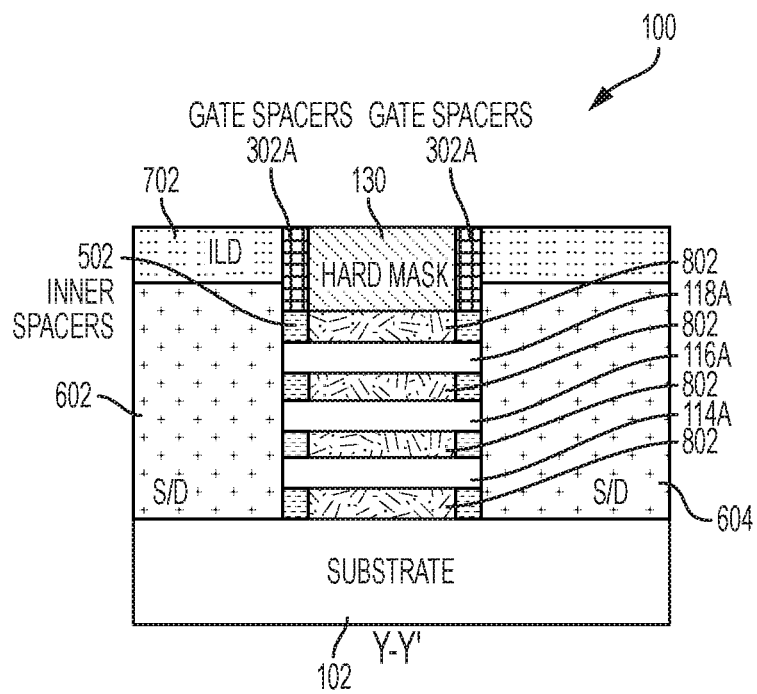
FIG. 9B depicts a cross-sectional view of the nanosheet-based structure taken along line Y-Y' after fabrication operations in accordance with aspects of the invention.

FIG. 9A depicts a cross-sectional view of the nanosheet-based structure 100 taken along line X-X' after fabrication operations in accordance with aspects of the invention, and FIG. 9B depicts a cross-sectional view of the nanosheet-based structure 100 taken along line Y-Y' after fabrication operations in accordance with aspects of the invention. As best shown in FIG. 9A, known semiconductor fabrication operations have been used to recess the gate stack 802 to the level shown to make room for a cap layer 1002 (shown in FIG. 10A).

Figure 10A:
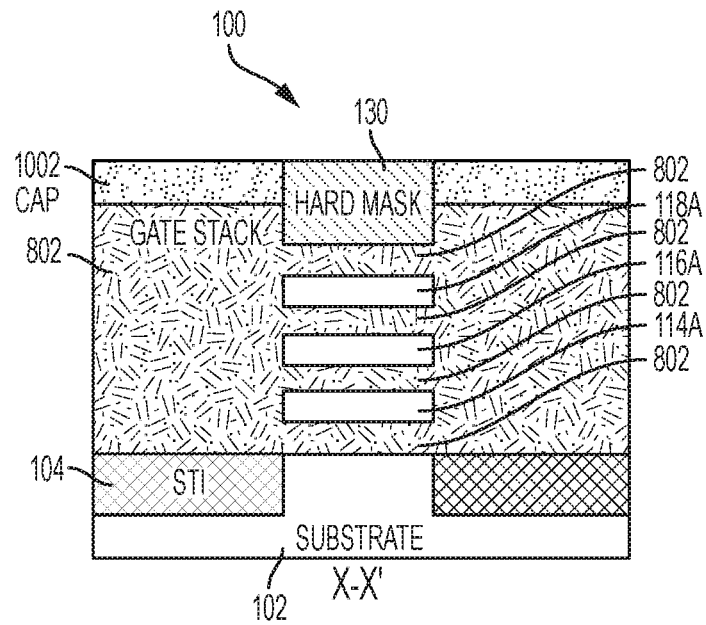
FIG. 10A depicts a cross-sectional view of the nanosheet-based structure taken along line X-X' after fabrication operations in accordance with aspects of the invention.
Figure 10B:
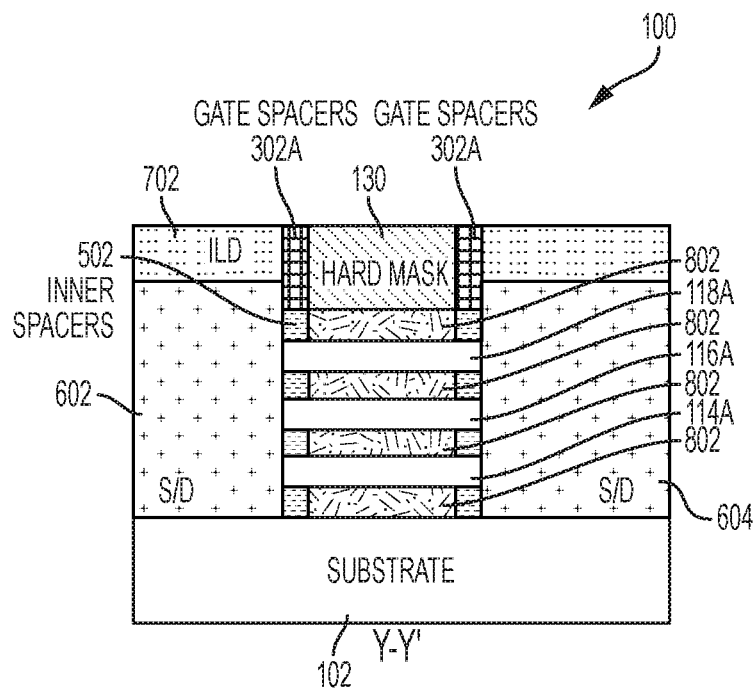
FIG. 10B depicts a cross-sectional view of the nanosheet-based structure taken along line Y-Y' after fabrication operations in accordance with aspects of the invention.

FIG. 10A depicts a cross-sectional view of the nanosheet-based structure 100 taken along line X-X' after fabrication operations in accordance with aspects of the invention, and FIG. 10B depicts a cross-sectional view of the nanosheet-based structure 100 taken along line Y-Y' after fabrication operations in accordance with aspects of the invention. As best shown in FIG. 10A, known semiconductor fabrication operations have been used to deposit the cap layer 1002 over the recessed gate stack 802. In embodiments of the invention, the cap layer 1002 can be formed from a nitride or an oxide layer.

Figure 11A:
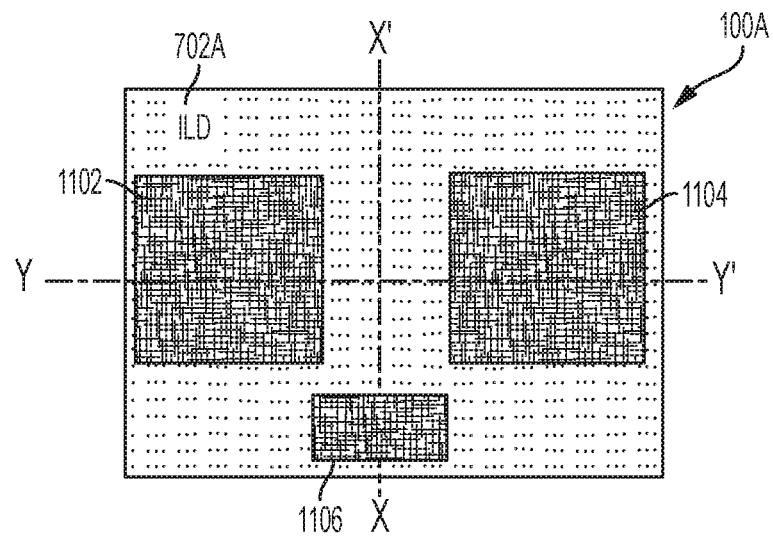
FIG. 11A depicts a top-down view of the nanosheet FET after fabrication operations in accordance with aspects of the present invention.
Figure 11B:
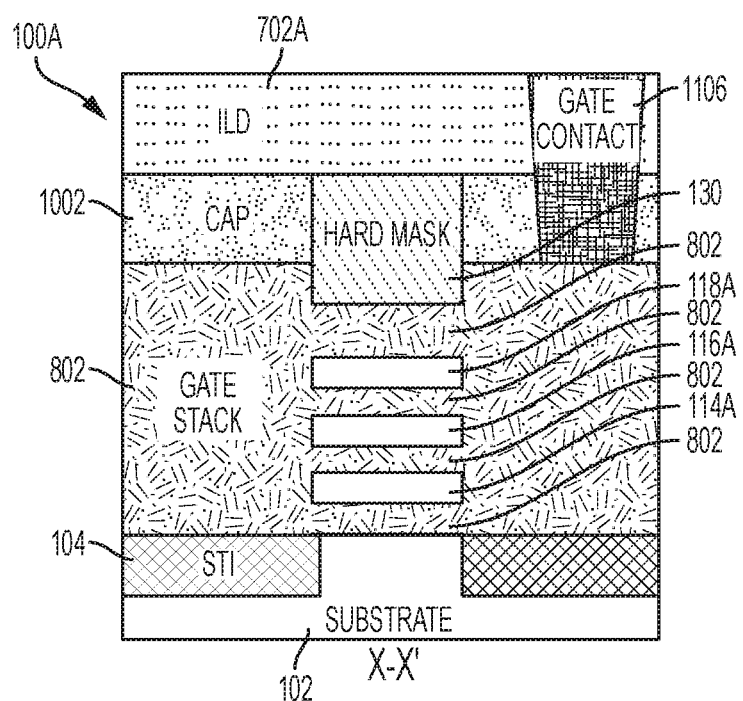
FIG. 11B depicts a cross-sectional view of the nanosheet FET shown in FIG. 11A taken along line X-X'.
Figure 11C:
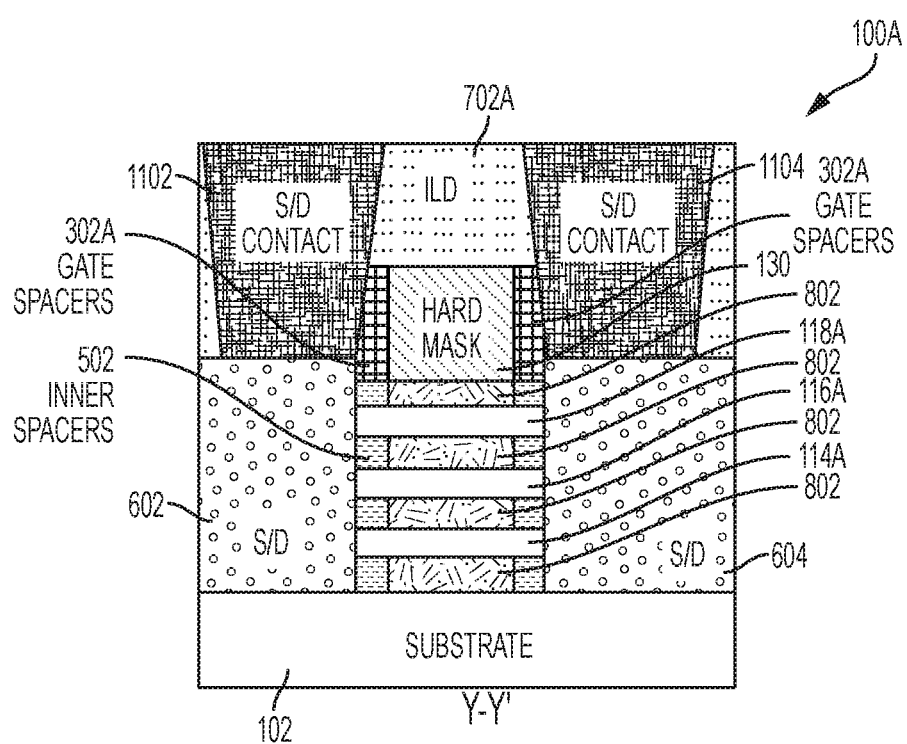

FIG. 11A depicts a top-down view of a final nanosheet FET 100A after fabrication operations in accordance with aspects of the present invention. FIG. 11B depicts a cross-sectional view of the nanosheet FET 100A taken along line X-X' shown in FIG. 11A, and FIG. 11C depicts a cross-sectional view of the nanosheet FET 100A taken along line Y-Y' shown in FIG. 11A. As best shown in FIG. 11B and FIG. 11C, known semiconductor fabrication operations have been used to deposit on the nanosheet-based structure 100 (shown in FIGS. 10A, 10B) additional ILD material to form ILD 702A. As best shown in FIGS. 11A, 11B, and 11C, S/D contact trenches (not shown) and gate contact trenches (not shown) have been formed through the ILD 702A and the cap layer 1002. Known fabrication processes were then used to deposit a gate contact 1106 in the gate contact trench, and deposit S/D contacts 1102, 1104 in the S/D contact trenches. The process the deposit the S/D contacts 1102, 1104 and the gate contact 1106 can be considered self-aligned in that only exiting structures in the nanosheet FET 100A are used to define the footprint of the contacts 1102, 1104, 1106.

Accordingly, it can be seen from the foregoing detailed description that aspects of the invention provide technical benefits and effects. Embodiments of the invention provide fabrication methods and resulting structures for nanosheet transistor gate structures having reduced parasitic gate capacitance. In embodiments of the invention, selected regions of the gate structure are replaced with a "permanent"

or "hard mask" dummy gate region (hard mask 130), which, unlike the other dummy gate structures (e.g., dummy gate 202) formed during the fabrication process, is not replaced with a metal gate stack. The hard mask dummy gate region is selected to be a region that will, in the final nanosheet FET device, overlap the S/D drain contacts, the gate contacts, and/or the S/D regions if the S/D regions are tall enough. Because the hard mask dummy gate structure is substantially non-conductive, when it overlaps the S/D drain contacts, the gate contacts, and/or the S/D regions, the hard mask dummy gate structure generates no meaningful parasitic capacitance.

In embodiments of the invention, a hard mask material (e.g., a nitride) is used to pattern and form an elongated fin-shaped structure in an alternating stack of channel nanosheets and sacrificial nanosheets. In known nanosheet transistor fabrication operations, the hard mask used to pattern and form the fin-shaped alternating stack of channel nanosheets and sacrificial nanosheets is removed and the space that was occupied by the hard mask is ultimately occupied first by the amorphous silicon dummy gate and then the replacement metal gate. However, in accordance with aspects of the invention, after patterning the fin-shaped alternating stack of channel/sacrificial nanosheets, the hard mask remains and functions as the hard mask dummy gate region. In accordance with aspects of the invention, the amorphous silicon dummy gate is formed over and around the hard mask dummy gate, S/D regions are formed, and a replacement metal gate (RMG) process is applied to replace the amorphous silicon dummy gate with a metal gate stack. S/D contacts are formed to the S/D regions, and gate contacts are formed to the metal gate stack. Because the hard mask or permanent dummy gate was intentionally positioned to occupy a region that would, in a conventional fabrication process, have been occupied by the metal gate stack and would have overlapped with the S/D drain contacts, the gate contacts, and/or the S/D regions, no meaningful parasitic gate capacitance is generated. Additionally, because the hard mask dummy gate structure is substantially non-conductive, when it overlaps the S/D drain contacts, the gate contacts, and/or the S/D regions, the hard mask dummy gate structure generates no meaningful parasitic capacitance.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    performing fabrication operations to form a nanosheet field effect transistor device on a substrate, wherein the fabrication operations include:
        forming a channel stack over the substrate, wherein the channel stack comprises stacked and spaced apart channel nanosheets;
        forming a metal gate located adjacent to end regions of the channel stack and further located around and between the stacked and spaced apart channel nanosheets; and
        forming a permanent dummy gate above the channel stack.

2. The method of claim 1 further comprising forming a source or a drain (S/D) region above the substrate and adjacent to the channel stack.

3. The method of claim 2 further comprising forming a S/D contact communicatively coupled to the S/D region.

4. The method of claim 3, wherein the S/D contact is adjacent to and spaced apart from the permanent dummy gate.

5. The method of claim 4, wherein a dielectric gate spacer is adjacent the permanent dummy gate.

6. The method of claim 5, wherein the dielectric gate spacer is between the permanent dummy gate and the S/D contact.

7. The method of claim 6, wherein the permanent dummy gate, the dielectric gate spacer and the S/D contact do not generate parasitic capacitance.

8. The method of claim 1 further comprising forming a gate contact communicatively coupled to the metal gate.

9. The method of claim 8, wherein the gate contact is adjacent to and spaced apart from the permanent dummy gate.

10. The method of claim 9, wherein a dielectric cap region is adjacent the permanent dummy gate.

11. The method of claim 10, wherein the dielectric cap region is between the permanent dummy gate and the gate contact.

12. The method of claim 11, wherein the permanent dummy gate, the dielectric cap region and the gate contact do not generate parasitic capacitance.

13. A nanosheet field effect transistor device comprising:
a channel stack formed over a substrate, wherein the channel stack comprises stacked and spaced apart channel nanosheets;
a metal gate located adjacent to end regions of the channel stack and further located around and between the stacked and spaced apart channel nanosheets; and
a permanent dummy gate formed above the channel stack.

14. The device of claim 13 further comprising forming a source or a drain (S/D) region above the substrate and adjacent to the channel stack.

15. The device of claim 14 further comprising a S/D contact communicatively coupled to the S/D region.

16. The device of claim 15, wherein the S/D contact is adjacent to and spaced apart from the permanent dummy gate.

17. The device of claim 16, wherein a dielectric gate spacer is adjacent the permanent dummy gate.

18. The device of claim 17, wherein the dielectric gate spacer is between the permanent dummy gate and the S/D contact.

19. The device of claim 18, wherein the permanent dummy gate, the dielectric gate spacer and the S/D contact do not generate parasitic capacitance.

20. The device of claim 19 further comprising:
forming a gate contact communicatively coupled to the metal gate;
wherein the gate contact is adjacent to and spaced apart from the permanent dummy gate;
wherein a dielectric cap region is between the permanent dummy gate and the gate contact;
wherein the permanent dummy gate, the dielectric cap region and the gate contact do not generate parasitic capacitance.

* * * * *